United States Patent [19]
Shirato et al.

[11] Patent Number: 4,737,471
[45] Date of Patent: Apr. 12, 1988

[54] METHOD FOR FABRICATING AN INSULATED-GATE FET HAVING A NARROW CHANNEL WIDTH

[75] Inventors: Takehide Shirato, Hiratsuka; Taiji Ema, Kawasaki, both of Japan

[73] Assignee: Fujitsu Limited, Kawasaki, Japan

[21] Appl. No.: 875,534

[22] Filed: Jun. 18, 1986

[30] Foreign Application Priority Data

Jun. 19, 1985 [JP] Japan .................. 60-133831

[51] Int. Cl.⁴ .............................................. H01L 21/82
[52] U.S. Cl. ........................................ 437/44; 437/29; 437/45; 437/953; 148/DIG. 82
[58] Field of Search ............... 29/571, 576 B, 590; 148/1.5, 187

[56] References Cited

U.S. PATENT DOCUMENTS

| | | | |
|---|---|---|---|
| 4,108,686 | 8/1978 | Jacobus, Jr. | 148/1.5 |
| 4,525,920 | 7/1985 | Jacobs et al. | 29/576 B |
| 4,535,532 | 8/1985 | Lancaster | 29/576 B |
| 4,562,638 | 1/1986 | Schwabe et al. | 29/577 C |
| 4,569,117 | 2/1986 | Baglee et al. | 29/571 |
| 4,590,665 | 5/1986 | Owens et al. | 29/571 |
| 4,601,098 | 7/1986 | Oda | 29/571 |

FOREIGN PATENT DOCUMENTS

| | | |
|---|---|---|
| 2640694A1 | 9/1976 | Fed. Rep. of Germany . |
| 57007153 | 6/1980 | Japan . |
| A2123605 | 2/1983 | United Kingdom . |

OTHER PUBLICATIONS

IEEE Transactions on Electron Devices, vol. ED-20, No. 12, Dec. 1973, pp. 1129–1132, New York, U.S.; R. A. Moline et al.: "Self-Aligned Maskless Chan Stops for IGFET Integrated Circuits".

Primary Examiner—Upendra Roy
Attorney, Agent, or Firm—Staas & Halsey

[57] ABSTRACT

A method of fabricating a narrow channel width IG-FET which includes compensating for impurities diffused into the channel region from the channel stopper, thereby providing the IG-FET with a threshold providing the IG-FET with a threshold voltage establishing at a level substantially the same as that of conventional wider channel width IG-FETs. According to the present invention, impurities having a conductivity type opposite to that of the impurities diffused from the channel stopper are selectively implanted in at least the channel region of the narrow channel width IG-FET, to compensate the diffused impurities. Impurities for channel doping are then implanted to adjust the threshold voltage.

14 Claims, 3 Drawing Sheets

METHOD FOR FABRICATING AN INSULATED-GATE FET HAVING A NARROW CHANNEL WIDTH

BACKGROUND OF THE INVENTION

1. Field Of The Invention

The present invention relates to a method of fabricating an insulated-gate field effect transistor (IG-FET) having a channel with a relatively narrow width, i.e., 2 microns or less, and in which lateral diffusion of field impurities doped to form a so-called "channel stopper" occurs, and more specifically, to a method of fabricating an IG-FET which lowers the threshold voltage to a desired level even when the channel is entirely filled with the laterally diffused field impurities.

2. Description Of The Related Art

The reduction of the scale of semiconductor devices, such as transistors, is a major issue for semiconductor integrated circuit (IC) manufacturers with regard to increasing packing density and operating speed, and further to reducing power consumption of semiconductor ICs. For increases in the operating speed, the channel length of IG-FETs or metal-insulator-semiconductor (MIS) FETs incorporated in integrated circuits have been decreased to a dimension near 1.5 microns; further decreases in the channel length are continually being devised. At the same time, reductions in the width of the channel have been provided to decrease power consumption in IG-FETs which do not require high speeds or large current capacities. After the channel width of an IG-FET has been decreased to a dimension near 2 microns or less, the threshold voltage of the FET rises as the width decreases. The threshold voltage increase associated with a narrow channel width is considered to be a result of structure of narrow channel IG-FETs. (W. A. Noble et al. "Narrow Channel Effect in Insulated Gate Field Effect Transistors" Proc. of IEEE 1976 International Electron Devices, pp. 582–586).

Impurities diffused into the channel from the surrounding region, particularly impurities which are doped in the field to establish a desired field inversion threshold voltage, are also considered to cause an increase in the threshold voltage when the channel width is reduced. Such impurities are selectively doped into the field around the active region (transistor region) in which the FET is formed. The impurities are diffused downwardly in the semiconductor substrate into a region below the field oxide layer; the downward diffusion occurs during the heat processing performed to form a field oxide layer. The region doped with such impurities is referred to as a channel stopper. However, a lateral diffusion of the impurities into the active region occurs—the degree of lateral diffusion corresponding to the depth of the downward diffusion. This lateral diffusion causes the impurities forming the channel stopper to encroach upon the active region, and since these impurities have the same conductivity type as that of the portion of the substrate or well in which the associated IG-FET is formed, the threshold voltage of a FET increases if the impurity concentration in the channel of the FET is increased by laterally diffused impurities.

A technology known as a channel doping process is employed to adjust the threshold voltage of an IG-FET to a desired level. By selecting the conductivity type and the dosage of the impurities, the FET can be characterized as a depletion or enhancement type having the desired conductivity type and threshold voltage. Channel doping is sometimes performed to a relatively large depth, with respect to the thickness of the corresponding semiconductor device, to create a well in the substrate. The impurity concentration in the well may be controlled to establish a desired threshold voltage of an IG-FET formed therein.

In the channel doping process, a relatively low dosage of impurities is concurrently diffused into the remaining portions of IG-FETs, having the same conductivity type, formed on the semiconductor substrate. The concentration of the impurities provided by lateral diffusion, however, is higher than the concentration of impurities provided by channel doping. Accordingly, if an IG-FET having a narrow channel width is formed on the same semiconductor substrate as an IG-FET having a relatively wider channel width, the threshold voltage increase in a narrow channel width IG-FET due to the lateral diffusion cannot be controlled by conventional channel doping technology. Thus, using existing technology, a narrow channel IG-FET having a channel width of 2 microns or less cannot be put into practical use, much less incorporated in an IC chip including conventional wider channel IG-FETs.

SUMMARY OF THE INVENTION

It is, therefore, an object of the present invention to provide a method for preventing a threshold voltage increase in narrow channel width IG-FETs.

It is another object of the present invention to provide a method for fabricating narrow channel width IG-FETs in practical applications.

It is further another object of the present invention to provide a method for fabricating narrow channel width IG-FETs for incorporation in an integrated circuit including wide channel width IG-FETs.

The above objects can be attained by a method of the present invention for fabricating an IG-FET in a predetermined transistor region of a semiconductor substrate, the method comprises the steps of selectively implanting first impurities having a first conductivity type into the semiconductor substrate, heating the substrate to diffuse the first impurities throughout the channel region of the IG-FET, and selectively implanting second impurities having a second conductivity type into the transistor region so that the first impurities in at least the channel region are substantially compensated by the second impurities. The threshold voltage of the IG-FET is adjusted at a desired level by implanting third impurities into the channel region.

BRIEF DESCRIPTION OF THE DRAWINGS

Other objects and features of the present invention will be apparent in the reading of the following description of the disclosure and claims taken in connection with the accompanying drawings, in which:

DESCRIPTION OF THE PREFERRED EMBODIMENTS

Figure 1A:
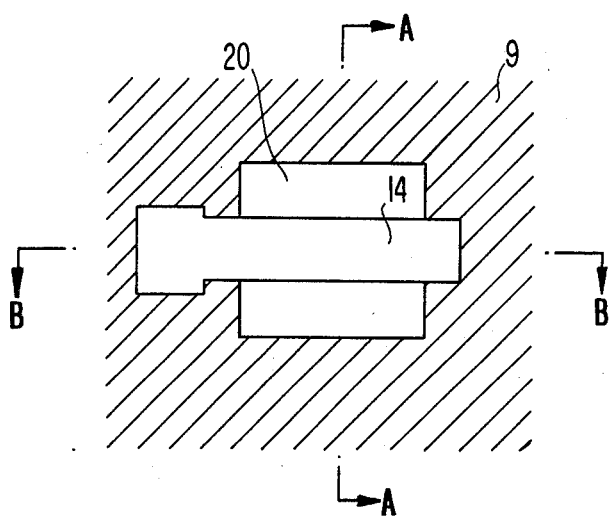
FIG. 1A is a plan view of a conventional IG-FET formed in a transistor region, illustrating a gate electrode thereof and a field oxide layer formed around the transistor region.
Figure 1B:
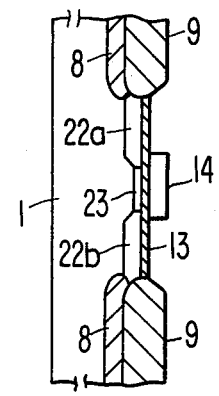
FIGS. 1B and 1C are cross-sectional views along the lines A—A and B—B in FIG. 1A, respectively, illustrating a channel stopper formed under the field oxide layer and encroaching on the transistor region.
Figure 1C:
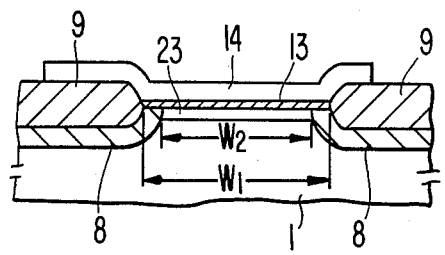

Prior to describing the present invention, conventional IG-FETs, shown in FIGS. 1 and 2, will be discussed. In particular, FIG. 1A is a plan view of an IG-FET formed in a transistor region 20, illustrating a gate electrode 14 and a field oxide layer 9 formed around the transistor region 20. FIGS. 1B and 1C are cross-sectional views taken along lines A—A and B—B in FIG. 1A, respectively, illustrating a semiconductor substrate 1, a channel stopper 8 formed under the field oxide layer 9, source or drain regions 22a and 22b (FIG. 1B) formed in the substrate 1, and the gate electrode 14 formed on a channel region 23 with the intervention of a gate insulating layer 13.

A shown in FIGS. 1B and 1C, the transistor region 20 is partially encroached on by impurities diffused from the channel stopper 8. Thus, the designed channel width W1 of 10 microns, for example, is reduced to a narrower width W2, as shown in FIG. 1C. In the channel length direction, as shown in FIG. 1B, the lateral impurity diffusion exhibits an encroachment on the source or drain regions 23.

Figure 2:
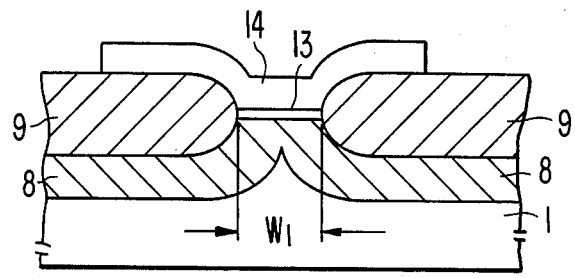
FIG. 2 is a cross-sectional view, in the channel width direction of a conventional IG-FET having a narrow width channel in which the impurities diffused from the channel stopper formed to surround the channel encroach upon the channel.

FIG. 2 is a cross-sectional view of a narrow width channel IG-FET, in the direction of the channel width thereof, wherein like numerals designate like or corresponding parts in FIGS. 1A–1C. The encroachment by the channel stopper impurities 8 extends into the channel by a distance corresponding to the thickness of the channel stopper, which is generally 0.8 to 1 micron. Accordingly, if the designed channel width W1 in FIG. 2 is 1.5 microns or less, the impurities diffused from the channel stopper 8 distribute throughout the channel region, as shown in FIG. 2. Thus, the impurity concentration in the channel region becomes much higher than that in the substrate 1, and the threshold voltage of the narrow channel width IG-FET increases to a level of 3 volts, for example, whereas the threshold voltage for an IG-FET in which the channel region is not fully encroached, as shown in FIGS. 1A and 1B, is 0.7 volts.

FIGS. 3A–3G are cross-sectional views for explaining an embodiment of the present invention, illustrating the various steps in the process of fabricating a narrow channel width IG-FET together with wider channel width IG-FETs on a semiconductor substrate. In this embodiment, the method of the present invention is applied to an n-type metal oxide semiconductor (MOS) FET having a channel width as narrow as 1.5 microns. The narrow channel width MOS FET is formed in a p-type well during the series of processes for providing CMOS (complementary MOS) FETs having conventional channel widths as large as 10 microns.

Figure 3A:
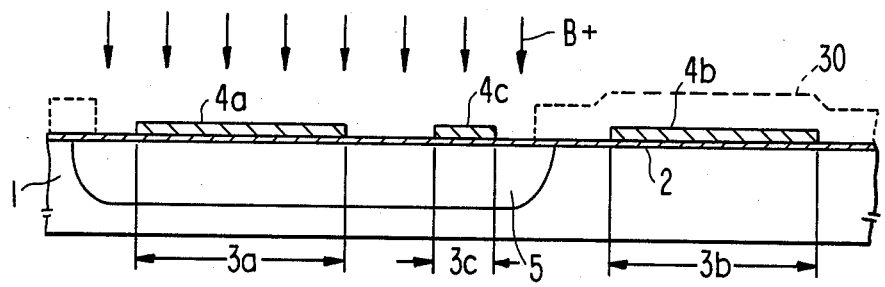
FIGS. 3A–3G are cross-sectional views illustrating an embodiment of the method of the present invention.

Referring to FIG. 3A, a thin silicon dioxide (SiO$_2$) layer 2 having a thickness ranging from 500 to 1000 Å is formed on the entire surface of a low concentration n-type silicon substrate 1 having specific resistance of 1 ohm, for example. Then, by using conventional chemical vapor deposition (CVD) and photolithographic technologies, silicon nitride (Si$_3$N$_4$) layers 4a, 4b and 4c are formed on the SiO$_2$ layer 2. The Si$_3$N$_4$ layers 4a, 4b and 4c cover predetermined regions 3a, 3b and 3c, respectively assigned for the formation therein of an n-type MOS FET and a p-type MOS FET, both having a conventional channel width, and an n-type MOS FET having the narrow channel width.

A resist layer 30 is applied to the surface of the substrate 1 and patterned to mask region 3b and the periphery thereof, as shown by a broken line in FIG. 3A. Then, boron ions (B+) with an energy of 160 KeV, for example, are implanted (or injected), typically at a dose of $1 \times 10^{13}$ ions/cm$^2$, for the purpose of creating a p-type well 5 in the substrate portion exposed by the resist layer. At this energy the boron ions (B+) penetrate the Si$_3$N$_4$ layers 4a and 4c but are almost completely absorbed by the resist layer 30. The resist layer 30 is then removed and the substrate 1 is subjected to an annealing process to form a p-type well 5 having a depth of approximately 3 microns in the substrate 1. The dosage of the implantation is selected to establish a threshold voltage of 0.6–1.0 volts for the n-type MOS FETs to be fabricated in the well 5.

Figure 3B:
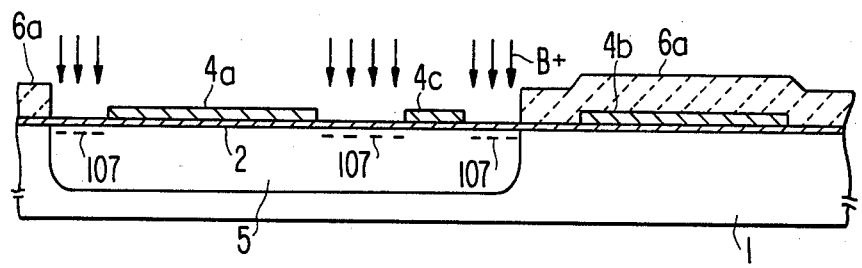

Subsequently, as shown in FIG. 3B, a resist layer 6a is applied to the surface of the substrate 1 and patterned to expose the region corresponding to the well 5. Boron ions (B+) with an energy of 25 KeV, for example, are implanted (or injected) in the exposed region at a dose of approximately $5 \times 10^{13}$ ions/cm$^2$. During this ion implantation, the boron ions (B+) incident on the resist layer 6a are almost completely absorbed therein. The energy of the boron ions (B+) is too low to penetrate the Si$_3$N$_4$ layers 4a and 4c, but large enough to pass through the SiO$_2$ layer 2, and accordingly, boron atoms are selectively implanted in substrate portions 107 located at the periphery of the Si$_3$N$_4$ layers 4a and 4c, i.e., in the portion of the well 5 surrounding the Si$_3$N$_4$ layers 4a and 4c.

Figure 3C:
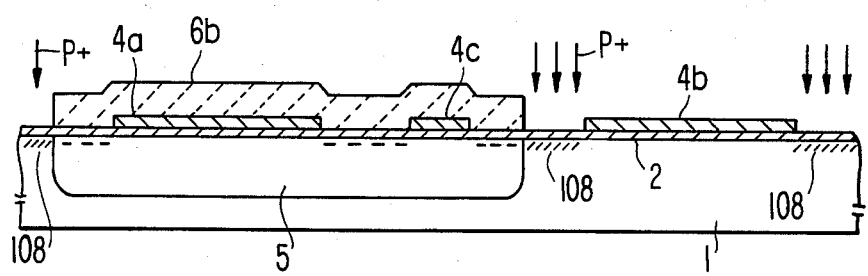

Following the second boron implantation, the resist layer 6a is removed and a resist layer 6b, shown in FIG. 3C, is applied to the surface of the substrate 1 and patterned to selectively mask the well 5. Phosphorus ions (P+) with an energy of 60 KeV, for example, are implanted (or injected) in the exposed region, typically at a dose of $3 \times 10^{12}$ ions/cm$^2$. During this ion implantation, the phosphorus ions (P+) incident on the resist layer 6b are almost completely absorbed therein. The energy of the phosphorus ions (P+) is too low to penetrate the Si$_3$N$_4$ layer pattern 4b, but large enough to pass through the Si$_3$N$_4$ layer 2; hence, a selective implantation of phosphorus ions (P+) occurs in substrate portions 108 located at the periphery of the pattern 4b.

Figure 3D:
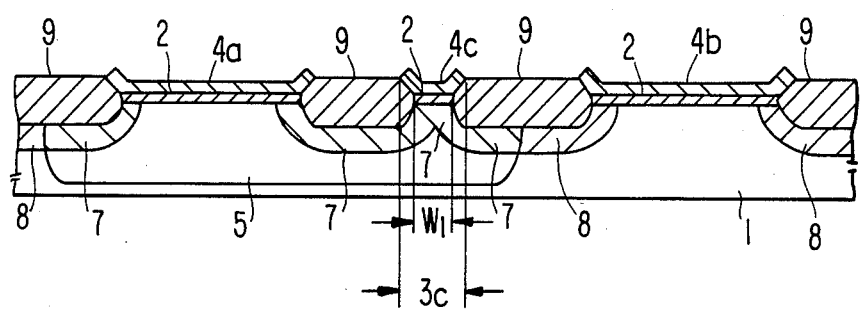

After the resist layer 6b is removed, the substrate 1 is processed to produce a field oxide layer utilizing a conventional local oxidation of silicon (LOCOS) technology. Specifically, the substrate 1 is heated in a wet oxygen atmosphere for about 10 hours at approximately 900° C., for example, with the Si$_3$N$_4$ layers 4a, 4b and 4c in place. The surface of the substrate portion around the Si$_3$N$_4$ layers 4a, 4b and 4c is selectively oxidized to form a thick SiO$_2$ layer 9, which is conventionally referred to as a field oxide, as shown in FIG. 3D. During the heating process, the boron and phosphorus atoms implanted in the regions 107 and 108 (FIGS. 3B and 3C), respectively, are activated and distributed to a depth of approximately 0.8 microns below the field oxide 9, thereby forming diffusion layers 7 and 8, respectively. The diffusion layers 7 and 8, conventionally referred to as channel stoppers, can improve the field threshold voltage characteristic of an IC comprising IG-FETs.

Each of regions 3a, 3b and 3c is encroached upon by the diffusion layer 7 and 8, i.e., by the impurities laterally diffused from the channel stoppers, as explained with reference to FIGS. 1A–1C. In particular, region 3c (FIG. 3A) for an n-type MOS FET having narrow channel width of 1.5 microns is entirely encroached on by the p-type diffusion layer 7 which has a thickness of approximately 0.8 microns. Thus, the impurity concentration in region 3c is almost the same as that in the diffusion layer (channel stopper) 7. As a result, the threshold voltage of the narrow channel width MOS FET to be formed in region 3c is much higher than that of the conventional channel width MOS FET to be formed in region 3a.

In accordance with the present invention, another selective doping utilizing opposite conductivity type impurities is employed to compensate for the impurities diffused in region 3c from the channel stopper 7. Specifically, in this embodiment, n-type impurities are selectively implanted (or injected) in region 3c in which a narrow channel width MOS FET is to be formed, to compensate for the increase in the p-type impurity concentration in the region.

Figure 3E:
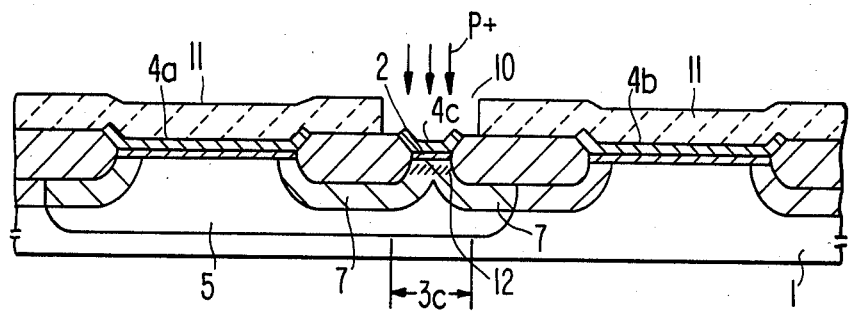

Referring to FIG. 3E, a resist layer 11, having an opening 10 to expose region 3c, is applied to the surface to the substrate 1, and phosphorus ions (P+) are selectively implanted at an energy of approximately 180 KeV in region 3c through the opening 10 at a dose in the range between $1 \times 10^{11}$ and $1 \times 10^{12}$ ions/cm$^2$. The phosphorus n-type impurities, as implanted, are concentrated in a region 12 adjacent to the surface of the substrate 1. In this compensating implantation, the field oxide 9 around region 3c as well as the resist layer 11, serve as a mask, and therefore the opening 10 can be designed to be larger than the dimensions of the region 3c. Accordingly, the alignment of the opening 10 with respect to region 3c is not critical.

Figure 3F:
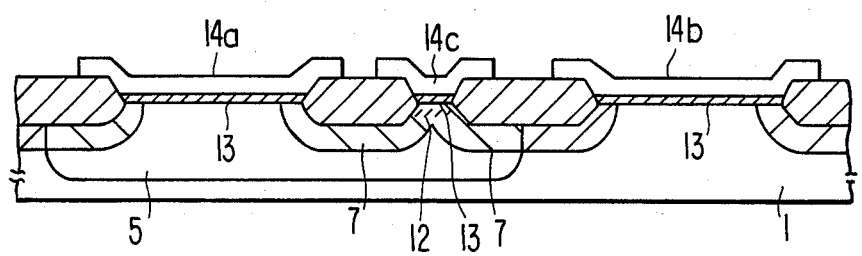

After the above steps, MOS FETs, each having a narrow or wide channel, are fabricated in the respective regions 3a, 3b an 3c, according to the conventional process steps. First, the Si$_3$N$_4$ layer patterns 4a, 4b and 4c and the thin SiO$_2$ layer 2 are removed. Then, as shown in FIG. 3F, gate oxide layers 13 are formed on the surface of the regions which had been defined by the Si$_3$N$_4$ layer patterns 4a, 4b and 4c and at this stage are exposed through the openings of the field oxide layer 9. The gate oxide layers 13 can be produced by using a conventional thermal oxidation method. Subsequently, gate electrodes 14a, 14b and 14c comprising polysilicon layers, for example, are respectively formed on regions 3a, 3b and 3c, with the intervention of the respective gate oxide layers 13, utilizing conventional CVD and photolithographic technologies.

Heavy dosages of n-type and p-type impurities are then implanted in the substrate 1 and well 5, respectively, to provide the source and drain for each of the narrow and wider channel width MOS FETs. To perform this implant, a photoresist layer (not shown) is applied to the surface of the substrate 1 and patterned to mask the region 3b (FIG. 3A) and the periphery thereof. Then, a high dose of n-type impurities, for example arsenic ions (As+), are implanted (or injected) in regions 3a and 3c (FIGS. 3A and 3E); the gate electrodes 14a and 14c as well as the photoresist layer serve as the mask during the selective implantation of the n-type impurities in regions 3a and 3c. Thus, the respective source and drain regions for the narrow and wider channel width n-type MOS FETs are provided with a high dosage of the n-type impurities. The arsenic ions (As+) are implanted at an energy of 70 KeV and dosage of $4 \times 10^{15}$ ions/cm$^2$.

The photoresist mask (not shown) is removed and another new photoresist layer (not shown) is applied to the surface of the substrate 1 and patterned to expose region 3b. Utilizing this new photoresist mask, boron ions (B+) are implanted (or injected) at an energy of 25 KeV in the region 3b with a dose of $1 \times 10^{15}$ ions/cm$^2$ to create the source and drain of the wider channel width p-type MOS FET. Then, the ion energy is increased to 180 KeV to perform the above-mentioned channel doping of the substrate 1 through the gate electrode 14b. The dosage employed in the channel doping is between $1 \times 10^{11}$ and $1 \times 10^{12}$ ions/cm$^2$.

Figure 4:
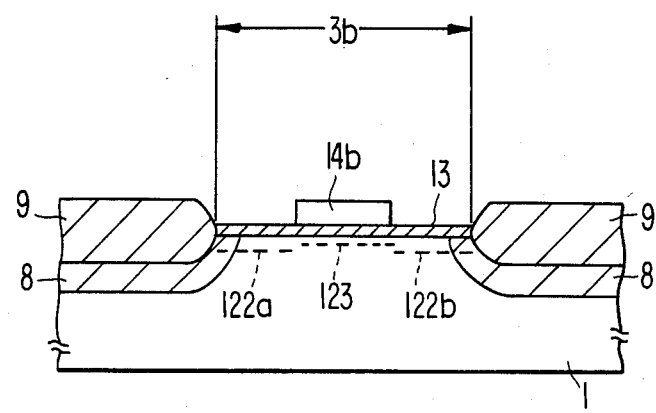
FIG. 4 is a cross-sectional view of the structure shown in FIG. 3F along the direction perpendicular to the gate electrode.

FIG. 4 is a cross-sectional view in the direction perpendicular to the gate electrode 14b in FIG. 3F. FIG. 4 shows the respective implantation of a relatively low concentration of boron atoms in the channel region 123 and a high concentration boron atoms in the source and drain regions 122a and 122b for the p-type MOS FET to be fabricated in region 3b.

Figure 3G:
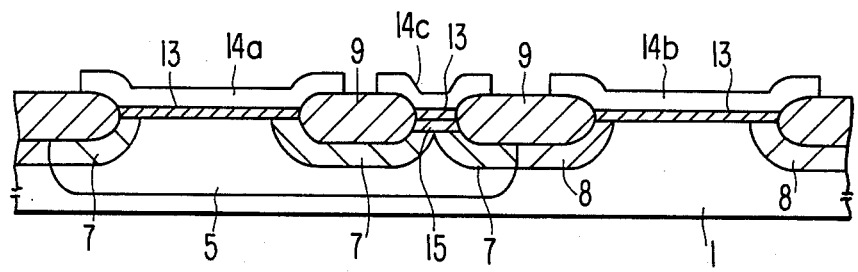

Thereafter, the substrate 1 is annealed to activate the impurities implanted in regions 3a, 3b and 3c. In particular, the arsenic atoms implanted as n-type impurities in regions 3a and 3c and the boron atoms implanted as p-type impurities in region 3b are activated to provide their specific functions as the drains and sources. At the same time, the compensating phosphorus atoms concentrated in the region 12 (FIGS. 3E and F) adjacent to the surface of the substrate 1 in region 3c are activated and distributed to provide a channel region 15, as shown in FIG. 3G. In the channel region 15, the increase in the p-type impurities diffused from the channel stopper 7 is compensated for by the n-type phosphorus ions implanted therein, and a threshold voltage of 0.6 to 1 volt is established for the narrow channel width MOS FET formed in region 3c, corresponding to the impurities concentration of the well 5.

Referring again to FIG. 4, the boron atoms implanted in regions 122a, 122b and 123 are also activated during the annealing process and are distributed to provide the source and drain, and the channel, for the p-type wider channel MOS FET formed in region 3b. (The arrangement of the regions is exemplified by the source and drain regions 22a and 22b and the channel region 23 shown in FIG. 1B). Thus, according to the present invention, a narrow channel width MOS FET having a threshold voltage of, for example, 0.7 volts can be fabricated at the same time, and on the same semiconductor substrate, as wider channel width n-type and p-type MOS FETs having the same threshold voltage, while a field inversion threshold is maintained at a level 25 volts or larger.

The third impurities implanted in the channel region to adjust the level of the threshold voltage may be of the first or second conductivity type. If the third impurities are of the second conductivity type, the IG-FET will be a second conductivity depletion type device; if they are of the first conductivity type, the IG-FET will be a first conductivity type enhancement device.

As described with reference to the above embodiment, the impurities diffused from the channel stopper and distributed throughout the channel region of an IG-FET having a channel width as narrow as 1.5 microns are compensated for by opposite conductivity type dopants implanted in the channel region. Thus, the threshold voltage of the narrow channel width IG-FET can be established at a level substantially equal to the threshold level of a conventional IG-FET having a relatively wider channel width, such as 10 microns. Accordingly, the present invention provides for the design and production of semiconductor integrated circuits including an IG-FET with a channel width as narrow as 1.5 micron, or less, without regard to impurities laterally diffused from a channel stopper.

The present invention can be applied to the fabrication of a narrow channel width IG-FET in a substrate instead of a well, as in the above embodiment. In such a case, the channel doping for adjusting the threshold voltage of the narrow channel width FET may be conducted after the gate electrode thereof is formed on the channel region, as explained with reference to FIG. 4, in which the impurities for the channel doping are implanted in the channel region 123 through the gate electrode 14b. Further, the compensating impurities, such as boron ions, may be implanted through the gate electrode if the narrow channel width IG-FET is formed either in a substrate or a well.

Moreover, the present invention can be applied to the fabrication of IG-FETs, in which the respective conductivity types of the substrate, the well and the impurities for the compensation implant and channel doping are opposite to those described in the embodiment. Moreover, the compensation implant can generally be applied to IG-FETs other than narrow channel width IG-FETs. Still further, the present invention is effectively applied to avoid the punch-through effect in a short channel length IG-FET is decreased to be 2 microns or less, and the compensating impurity implantation is performed to a relatively shallow depth in the channel region so as to leave a high concentration region, containing the laterally diffused impurities, below the compensated region. In the narrow width and short channel IG-FET, the channel conduction is maintained in the shallow compensated region and punch-through is prevented in the deeper region due to the high concentration of impurities.

In the above embodiment, the channel region of a narrow channel width IG-FET is entirely filled with impurities diffused from the channel stopper formed around the FET; however, the present invention is also effective for a narrow channel width IG-FET in which the channel region is not entirely filled with such laterally diffused high concentration remaining between the encroaching channel stoppers.

The many features and advantages of the present invention are apparent from the detailed specification, and thus it is intended that the appended claims cover all such features and advantages falling within the true spirit and scope of the invention. Further, since numerous modifications and changes will readily occur to those skilled in the art, it is not desired to limit the invention to the exact construction, steps and/or operation illustrated and described, and according all suitable modifications and equivalents falling within the scope of the invention may be resorted to.

What is claimed i s:

1. A method for fabricating an insulated-gate field-effect-transistor (IG-FET), having a channel region in a transistor region of a semiconductor substrate, the width of said channel region being less than or equal to twice the thickness of channel stoppers located on both sides of said channel region, said method comprising the steps of:
   (a) selectively implanting first impurities into portions of the semiconductor substrate surrounding the transistor region, the first impurities having a first conductivity type which is opposite the conductivity type of the semiconductor substrate surrounding the transistor region;
   (b) diffusing the first impurities into the channel region; and
   (c) selectively implanting second impurities having a second conductivity type, oppostie the first conductivity type, into the transistor region to compensate for the first impurities diffused into the channel region.

2. The method of claim 1, further comprising step (d), which is executed before said step (a), for forming a well region having a conductivity type opposite the conductivity type of the semiconductor substrate.

3. The method of claim 1, wherein said step (b) comprises annealing the semiconductor substrate.

4. The method of claim 1, wherein the width of the channel region is greater than zero but less than 2 microns.

5. The method of claim 2, wherein:
   said step (c) comprises implanting the second impurities so that the concentration of the second impurities in the channel region is equal to the concentration of the first impurities in the channel region; and
   said step (d) comprises implanting third impurities having the second conductivity type so that the IG-FET is of the second conductivity depletion type.

6. The method of claim 2, wherein:
   said step (d) comprises implanting third impurities having the first conductivity type into the channel region; and
   said step (c) comprises implanting second impurities so that the concentration of the second impurities in the channel region is equal to or higher than the concentration of the first impurities in the channel region and lower than the sum of the respective concentrations of the first and third impurities in the channel region, and so that the IG-FET is of the second conductivity enhancement type.

7. The method of claim 2, further comprising steps of:
   (e) forming an insulating layer on the transistor region; and (f) forming a gate electrode on portion of the insulating layer corresponding to the channel region layer;
   wherein said step (d) comprises ion implanting the third impurities into the channel region through the gate electrode and the insulating layer.

8. The method of claim 3, wherein the IG-FET is formed on the substrate together with another IG-FET having a channel region wider than approximately 2 to 10 microns.

9. The method of claim 6, wherein said step (d) comprises implanting the third impurities to a greater depth than the first impurities are implanted to provide a well of the first conductivity type in the semiconductor substrate for forming therein the IG-FET.

10. A method of fabricating an insulated gate field-effect transistor (IG-FET), including a channel region having a narrow width, in a transistor region of a semiconductor subtrate, the width of the channel region being less than or equal to the thickness of channel stoppers formed on both sides of the channel region, said method comprising the steps of:

(a) implanting first conductivity type ions into portions of the semiconductor substrate surrounding the transistor region;

(b) annealing the substrate to form a channel stopper, thereby diffusing the first impurities into the channel region;

(c) implanting second conductivity type ions into the transistor region to compensate for the first conductivity type impurities diffused into the channel region; and (d) implanting ions into the channel region to adjust the threshold voltage of the IG-FET.

11. The method of claim 10, further comprising the steps of:

(e) forming an insulating layer on the transistor region; and (f) forming a gate electrode of the portion of the insulating layer corresponding to the channel region.

12. The method of claim 10, wherein said step (d) comprises implanting second conductivity type ions so that the IG-FET is of the second conductivity depletion type.

13. The method of claim 10, wherein said step (d) comprises implanting first conductivity type ions so that the IG-FET is of the second conductivity enhancement type.

14. The method of claim 11, wherein said step (b) comprises annealing the IG-FET to form field oxide layers, so that the field oxide layers define the width of the channel region to be less than 2 microns.

* * * * *

UNITED STATES PATENT AND TRADEMARK OFFICE
CERTIFICATE OF CORRECTION

PATENT NO. : 4,737,471
DATED : APRIL 12, 1988
INVENTOR(S) : TAKEHIDE SHIRATO ET AL.

It is certified that error appears in the above-identified patent and that said Letters Patent is hereby corrected as shown below:

Col. 3, line 25, "A" should be --As--.

Col. 5, line 42, "an" should be --and--.

Col. 8, line 12, "oppostie" should be --opposite--;
line 47, "comprising" should be --comprising the--;
line 49, after "and", start a new paragraph, with paragraph indentation, beginning with "(f)";
line 49, "on" should be --on a--;
line 55, "3," should be --4,--.

Signed and Sealed this

Nineteenth Day of July, 1988

Attest:

DONALD J. QUIGG

Attesting Officer

Commissioner of Patents and Trademarks